United States Patent [19]
Haulin

[11] Patent Number: 5,996,102
[45] Date of Patent: Nov. 30, 1999

[54] ASSEMBLY AND METHOD FOR TESTING INTEGRATED CIRCUIT DEVICES

[75] Inventor: Tord L. Haulin, Uppsala, Sweden

[73] Assignee: Telefonaktiebolaget L M Ericsson (publ), Stockholm, Sweden

[21] Appl. No.: 08/920,077

[22] Filed: Aug. 26, 1997

Related U.S. Application Data

[63] Continuation of application No. 08/595,979, Feb. 6, 1996, abandoned.

[51] Int. Cl.$^6$ .................................................. G01R 31/28
[52] U.S. Cl. ............................................. 714/740; 714/32
[58] Field of Search ................................ 371/21.4, 22.31, 371/22.32, 25.1, 27.5, 27.3, 57.2; 395/183.15; 364/481, 482, 483, 489, 551.01, 718; 324/765, 538, 756; 714/8, 25, 32, 47, 721, 726, 727, 734, 740

[56] References Cited

U.S. PATENT DOCUMENTS

| | | | |
|---|---|---|---|
| 3,761,695 | 9/1973 | Eichelberger | 235/153 |
| 3,833,853 | 9/1974 | Milford | 324/73 R |
| 4,236,246 | 11/1980 | Skilling | 371/27 |
| 4,348,759 | 9/1982 | Schnurmann | 371/20 |
| 4,639,664 | 1/1987 | Chiu et al. | 324/73 AT |
| 4,660,197 | 4/1987 | Wrinn et al. | 371/1 |
| 4,683,569 | 7/1987 | Rubin | 371/25 |
| 4,862,067 | 8/1989 | Brune et al. | 324/73 R |
| 4,875,003 | 10/1989 | Burke | 324/73 |
| 4,912,709 | 3/1990 | Teske et al. | 371/22.1 |
| 4,970,454 | 11/1990 | Stambaugh et al. | 324/73.1 |
| 4,989,209 | 1/1991 | Littlebury et al. | 371/22.1 |
| 5,070,297 | 12/1991 | Kwon et al. | 324/158 P |
| 5,084,874 | 1/1992 | Whetsel, Jr. | 371/22.3 |
| 5,155,733 | 10/1992 | Blecha, Jr. | 371/22.5 |
| 5,196,788 | 3/1993 | Cistulli | 324/158 |
| 5,202,625 | 4/1993 | Farwell | 324/158 R |
| 5,220,281 | 6/1993 | Matsuki | 324/158 R |
| 5,260,947 | 11/1993 | Posse | 371/22.3 |
| 5,260,948 | 11/1993 | Simpson et al. | 371/22.3 |
| 5,268,639 | 12/1993 | Gasbarro et al. | 324/158 R |
| 5,323,107 | 6/1994 | D'Souza | 324/158 P |
| 5,331,274 | 7/1994 | Jarwala et al. | 324/158.1 |
| 5,365,167 | 11/1994 | Tanaka et al. | 324/158.1 |
| 5,428,624 | 6/1995 | Blair et al. | 371/22.3 |
| 5,450,415 | 9/1995 | Kamada | 371/22.3 |
| 5,450,418 | 9/1995 | Ganapathy | 371/24 |
| 5,483,175 | 1/1996 | Ahmad et al. | 324/766 |
| 5,513,186 | 4/1996 | Levitt | 371/22.3 |

FOREIGN PATENT DOCUMENTS

| | | |
|---|---|---|
| 0 296 884 | 12/1988 | European Pat. Off. . |
| 0 604 032 A2 | 6/1994 | European Pat. Off. . |

*Primary Examiner*—Robert W. Beausoliel, Jr.
*Assistant Examiner*—Nadeem Iqbal
*Attorney, Agent, or Firm*—Jenkens & Gilchrist, P.C.

[57] ABSTRACT

A testing assembly, and an associated method, for testing an integrated circuit device. The testing assembly is capable of testing an integrated circuit device having a large number of input and output terminals formed of either single-ended terminals or differential terminals. Static testing, both functional and parametric, can be performed upon the integrated circuit device. Additionally, dynamic testing of the integrated circuit device, even integrated circuit devices operable at high frequencies, is possible through operation of the testing assembly. Test signals are applied by way of signal rails to the device undergoing testing. A test signal response indicator is coupled to observe responses to the test signals.

30 Claims, 8 Drawing Sheets

ASSEMBLY AND METHOD FOR TESTING INTEGRATED CIRCUIT DEVICES

This is a continuation of application Ser. No. 08/595,979, filed Feb. 6, 1996, now abandoned.

TECHNICAL FIELD OF THE INVENTION

The present invention relates generally to electronic product testing. More particularly, the present invention relates to a testing assembly capable of testing and evaluating an integrated circuit device operable at high frequencies and having a large number of input and output terminals.

Test signals are applied, if desired, to each terminal of the integrated circuit device to permit testing of the entire integrated circuit device. Test signals can be applied both to differential terminals, and to single-ended terminals.

BACKGROUND OF THE INVENTION

The fabrication process by which an integrated circuit device is formed is a complex process. The integrated circuit device is fabricated upon a wafer, the integrated circuit (IC) wafer, and subsequently packaged into an integrated circuit (IC) package.

Even when the fabrication process is closely controlled and maintained under strict supervision, defective integrated circuit wafers are sometimes formed. And, packaging errors, such as missed connections or misconnections, can occur during packaging of the integrated circuit device. Testing for defects and packaging errors is therefore required to ensure that a defective IC package is not used in an electronic circuit.

On-wafer testing, subsequent to fabrication of the IC wafer and prior to packaging of the integrated circuit device can detect defects on the integrated circuit device. Testing for packaging errors must necessarily be performed subsequent to packaging operations. Sometimes, on-wafer testing is partially or completely deferred, and testing occurs only after packaging. Such deferral is, however, at the cost, typically, of the resultant need to discard an increased number of packaged, integrated circuit devices. Defects which would otherwise be detected on-wafer are detected only after packaging of the integrated circuit devices.

With the trend towards evermore densely populated integrated circuit devices having more highly integrated components operable at higher frequencies of operation, the problems attendant to the testing of an integrated circuit wafer or a packaged integrated circuit device formed therefrom become more complex.

As the integrated circuits have become increasingly more highly-integrated, boundary scan techniques for detecting faults have become widely utilized. Standard methodologies of boundary scan testing have been set forth. For instance, the Institute of Electrical and Electronics Engineers (IEEE) standard test access port and boundary scan architecture, IEEE Standard 1149.1-1990, has been promulgated to set forth industry-wide standards for boundary scan testing.

In general, such standards call for the formation of a test access port (TAP) state machine which allows control and access to a boundary scan architecture. To implement the boundary scan architecture, the integrated circuit device must include the boundary scan cells which are implemented between component terminals and internal logic circuitry of the integrated circuit device. The boundary scan cells are also connected together to form a shift register path around the periphery of the integrated circuit device, thus giving rise to the term boundary scan.

Boundary scan techniques can also be utilized to test the integrated circuit device while still on-wafer. Testing of the internal logic of the integrated circuit device is possible by way of the test port. Boundary scan functions can be used for the testing of primary inputs and outputs of the integrated circuit device to achieve controllability and observability of the chip-interior side of the input and output terminals.

Conventionally, automatic test equipment (ATE) is utilized for testing of integrated circuit devices. Conventional ATE typically includes a "testhead" and a workstation to provide operator control of the integrated circuit device undergoing testing, the "device under test" (DUT). A fixture is required to interconnect, or interface, the testing equipment with the integrated circuit device. Such a fixture is of dimensional, and other, characteristics corresponding to the particular integrated circuit device. A probe card having pin contactors, or probe "needles", for connecting with terminals of the integrated circuit device connects the integrated circuit device with the test resources of the ATE. The ATE typically utilizes three kinds of test resources: drivers which drive logic inputs, comparators for interpreting output data, and programmable power supplies.

As the integrated circuit devices become increasingly integrated and have increasing numbers of input and output terminals, commensurate increase in the capacity of ATEs to test the integrated circuit devices, particularly at the high frequencies of operation of the integrated circuits is not practical. Further, differential terminals are oftentimes utilized in high-speed integrated circuit devices. Differential terminals are formed of terminal pairs in which differential signals are offset in voltage relative to one another, one signal referred to as the positive signal and the other signal referred to as the negative signal. An external positive differential of signals applied to a terminal pair corresponds to an internal logical "1", an external negative differential corresponds to an internal logical "0". To be able to measure correctly a differential signal in a non-idealized environment, differential receivers are required. Existing ATEs include merely voltage comparators capable of quantizing signals in three voltage windows relative to a ground potential and are additionally inadequate to test many integrated circuit devices for this reason.

Therefore, existing apparatus and methodologies of testing complex, integrated circuit devices are inadequate to test properly the integrated circuit devices. And, as the size, complexity, and operational frequencies of state-of-the-art, integrated circuit devices continue to increase, the need for improved manners by which to test the integrated circuit devices shall become even more pressing.

Testing apparatus which permits appropriate and economic testing of such integrated circuit devices, operable at high frequencies of operation, is therefore necessary.

It is in light of this background information related to testing apparatus for testing integrated circuits that the significant improvements of the present invention have evolved.

SUMMARY OF THE INVENTION

The present invention advantageously provides a testing assembly, and an associated method, for testing an integrated circuit device, once fabricated. Static testing, both functional and parametric testing, and also dynamic testing of the circuit device can be performed through operation of the testing assembly.

Testing of an integrated circuit device having almost any number of input and output terminals is possible. Such terminals can be formed of single-ended terminals or differential terminal pairs, or any combination of such different types of terminals.

Testing operations can be performed either on-wafer or after packaging operations have been performed and the packaged integrated circuit packages have been created. When testing operations are performed upon the integrated circuit packages, connections formed during the packaging operations can further be tested.

Test signals can be applied to large numbers of terminals concurrently without the conventional requirement to utilize a large number of channels, otherwise required to test the integrated circuit devices.

Additionally, test signals can be applied to an integrated circuit device to permit dynamic testing of the circuit device to provide indications of operability of the integrated circuit device at high frequencies.

Testing of integrated circuit devices, both while still on-wafer and subsequent to packaging, can be economically performed. Integrated circuits determined to have either defects or connection errors can be marked, or otherwise set aside, to ensure that such defective circuit devices are not used in an electronic circuit.

In these and other aspects, therefore, a testing assembly, and an associated method, tests an integrated circuit having a plurality of terminals. A voltage signal generator generates test signals of selected voltage levels. A signal rail interconnects the voltage signal generator and at least selected terminals of a first group of the plurality of terminals of the integrated circuit. The signal rail concurrently applies the test signals generated by the voltage signal generator to the selected terminals. A test signal-response indicator is coupled to at least selected terminals of a second group of the plurality of terminals of the integrated circuits. A test signal-response indicator is coupled to the selected terminals of the plurality of terminals of the integrated circuit. The test signal-response indicator indicates values of output signals generated at the second group of terminals responsive to application of the test signals to the terminals. If the output signals indicated by the test signal-response indicator are of other than desired values, a circuit defect or connection problem might be the cause of such indication.

A more complete appreciation of the present invention and the scope thereof can be obtained from the accompanying drawings which are briefly summarized below, the following detailed description of the presently-preferred embodiments of the invention, and the appended claims.

DETAILED DESCRIPTION

Figure 1:
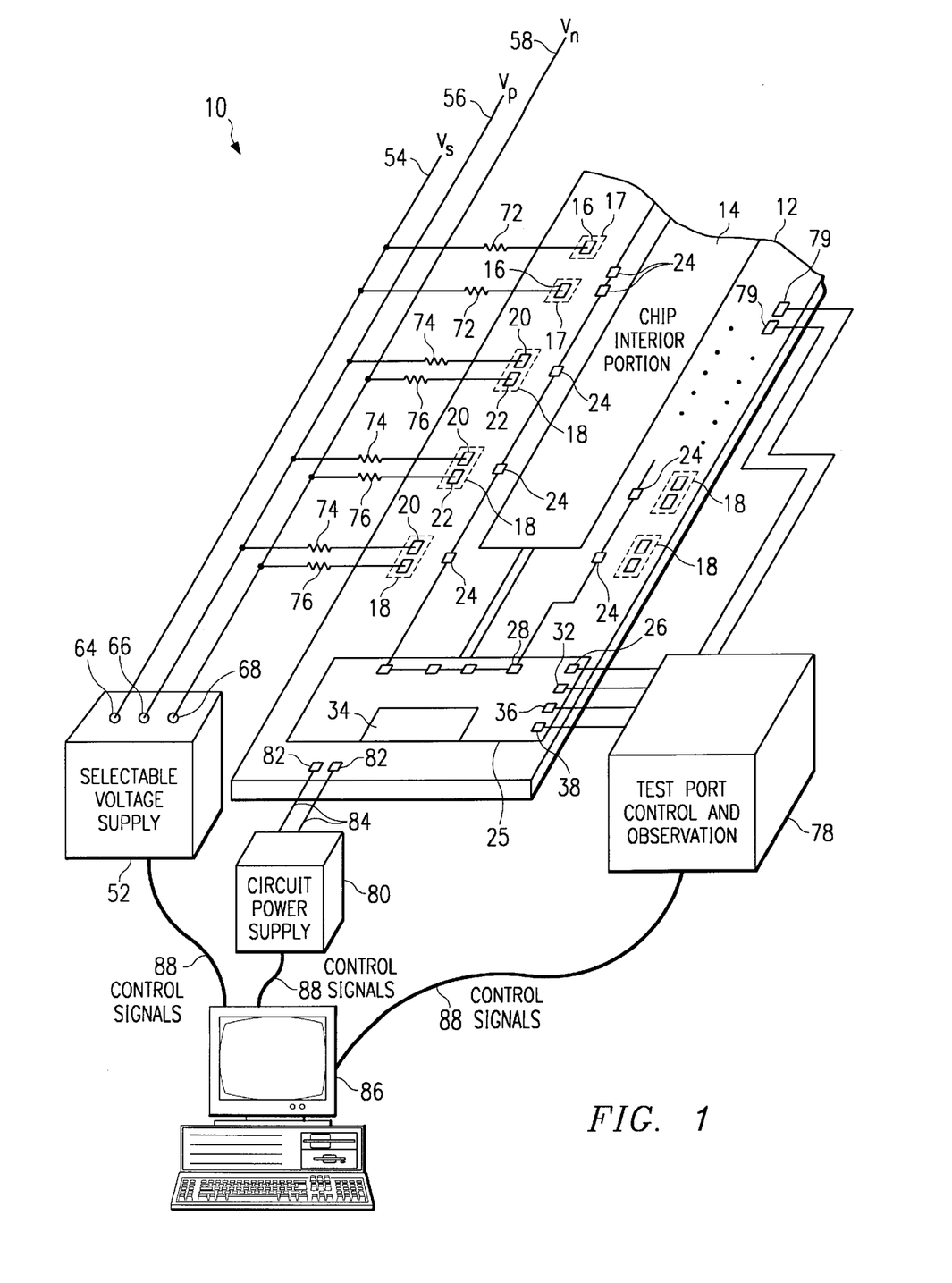
FIG. 1 is a partial, functional block, partial perspective illustration of the testing assembly of an embodiment of the present invention positioned to test an exemplary integrated circuit device.

Referring first to FIG. 1, a testing assembly, shown generally at 10, is positioned together with an integrated circuit device 12, a portion of which is illustrated in the figure. The integrated circuit device 12 illustrated in the figure is fabricated as part of an integrated circuit wafer.

In conventional manner, many integrated circuit devices are typically fabricated upon a single integrated circuit wafer. As mentioned previously, once fabricated, the integrated circuit devices are packaged to form integrated circuit packages. The testing apparatus 10 is also operable to test a packaged integrated circuit package, and the packaged integrated circuit package can instead be illustrated to form the integrated circuit device 12 in the figure. Additionally, while the testing assembly 10 is positioned together with only a single integrated circuit device 12, the testing assembly may also concurrently test additional numbers of the integrated circuit devices fabricated upon the wafer.

The portions of the integrated circuit device 12 illustrated in the figure include a chip interior portion 14, typically formed of a large number of circuit elements. The circuit elements are fabricated and interconnected to form a desired circuit. The chip interior portion 14 is coupled, in conventional manner, to input and output terminals, here single-ended, bidirectional terminals 16, each forming a cell 17 and differential, bi-directional terminal pairs 18, each formed of two terminals 20 and 22. When on-wafer, the terminals are sometimes referred to as "bond pads", and, once packaged, the terminals analogously are formed as "pins" or "leads."

Two single-ended terminals 16 and three differential pairs of terminals 20 and 22 illustrated in the figure are merely exemplary of the terminals typically forming portions of an integrated circuit device. Typically, an integrated circuit device includes large numbers of single-ended or differential terminal pairs, or combinations thereof.

As mentioned previously, as integrated circuit devices increasingly become more complex and include greater numbers of input and output terminals, use of conventional testing apparatus to test for proper operation of the integrated circuit device has become, at times, impractical. Such conventional, testing apparatus additionally is typically unable to test properly differential terminal pairs, or to test circuits which are operable at high frequencies.

The testing apparatus 10 overcomes the problems associated with conventional testing apparatus utilized to test integrated circuits. The apparatus 10 permits the application of testing signals to an integrated circuit having even very large numbers of terminals. The terminals can include single-ended, bi-directional input and output terminals, differential, bi-directional input and output terminals, or combinations of such terminals. And, test signals generated by the testing apparatus can further be applied to integrated circuit devices to test their operability at high frequencies.

The integrated circuit of the exemplary integrated circuit device 12 incorporates the standard, boundary scan elements in accordance with the aforementioned IEEE Standard 1149.1. The illustrated portion of the integrated circuit therefore further includes boundary scan cells 24 associated with each of the single-ended terminals 16 forming the cells 17 and the terminals 20 and 22 of the differential terminal pairs forming the cells 18. The boundary scan cells 24 are connected together to form a boundary scan register.

The boundary scan register formed of the boundary scan cells 24 is coupled to additional on-chip test logic 25, conventional of boundary scan circuitry here including the elements pictured in the block. A test data input (TDI) 26 and an instruction register 28 form portions of the test logic 25. A test data output (TDO) 32 is also coupled to the boundary scan register and the instruction register.

A test access port (TAP) controller 34, functionally operative as a state machine, is further pictured to receive inputs supplied at a test clock (TCK) terminal 36 and to a test mode select (TMS) terminal 38.

Additional details relating to, and describing operation of, the boundary scan architecture can be found in the aforementioned IEEE Standard.

The testing assembly 10 includes a selectable voltage supply 52 operable to generate test signals of selected voltage levels. The test signals are generated on supply rails 54, 56, and 58 which are coupled to the voltage supply 52 by way of output ports 64, 66, and 68, respectively, of the voltage supply.

The supply rail 54 contacts with the single-ended terminals 16 forming the cells 17 through resistors 72, the supply rail 56 contacts with the terminals 20 of the terminal pairs forming the cells 18 through resistors 74, and the supply rail 58 contacts with the terminals 22 of the terminal pairs forming the cells 18 through resistors 76. The resistors 72, 74, and 76 are each of impedance values which match closely the signaling environment in which the device under test is constructed to operate.

While, for purposes of illustration, only the terminals formed at the left-hand side (as-shown) of the portion of the integrated circuit device are shown in the figure, the supply rails can similarly be positioned to permit contact with additional terminals of the device, typically positioned near additional edge surfaces, or elsewhere, of the integrated circuit device.

The test signals formed at the output port 64 are of selected voltage levels $V_s$ which may be of selected sequences of voltage levels, as shall be described in greater detail below. Test signals of voltage levels $V_p$ are formed at the output port 66 of the voltage supply, and test signals of voltage levels $V_n$ are formed at the output port 68 of the voltage supply. The voltage levels of the test signals are generated to be of values, e.g., to function as a stimulus to receivers, to function as load voltages for transmitters, and to function as a stimulus and/or load voltage for built-in terminations. Such receivers, transmitters and built-in terminations form portions of the cells 17 and 18, as shall be noted below.

The testing assembly 10 further includes an observer and controller 78 which contacts with the test logic 25. Values of the boundary scan cells loaded into the test logic 25 responsive to generation and application of the test signals to the integrated circuit device 12 are observed by the controller 78. If the values observed by the controller 78 are other than desired values, a defect of the integrated circuit device 12 might exist. The observer and controller 78 can also be utilized for additional functions, inter alia, to test unidirectional terminals in conventional manner.

During operation of the testing assembly 10, test signals are generated. The test signals are applied to the terminals 16, 20 and 22. The values of the boundary scan cells are loaded into the test logic, and a determination can be made of the operability of the integrated circuit device 12 responsive to the observations of the test port observer and controller 78.

The illustrated portion of the integrated circuit further includes terminals 79, here coupled to receive signals generated by the controller and observer 78. As shall be described in detail with respect to FIG. 9 below, the terminals 79 extend to uni-directional receivers which form portions of the integrated circuit.

The testing assembly 10 further includes a plurality of power supplies, of which the circuit power supply 80 is exemplary. The power supply 80 supplies operative power to the power contacts 82 formed on the integrated circuit device 12 by way of lines 84. Each power supply can also have multiple numbers of contacts.

The selectable voltage supply 52, the test port observer and controller 78, and the power supply 80 are coupled to an exemplary work station 86 by way of cables 88. Control signals generated at the work station are transmitted upon the cables 88 to control operation of such devices, and signals generated at such devices can also be supplied to the workstation thereby.

Figure 2:
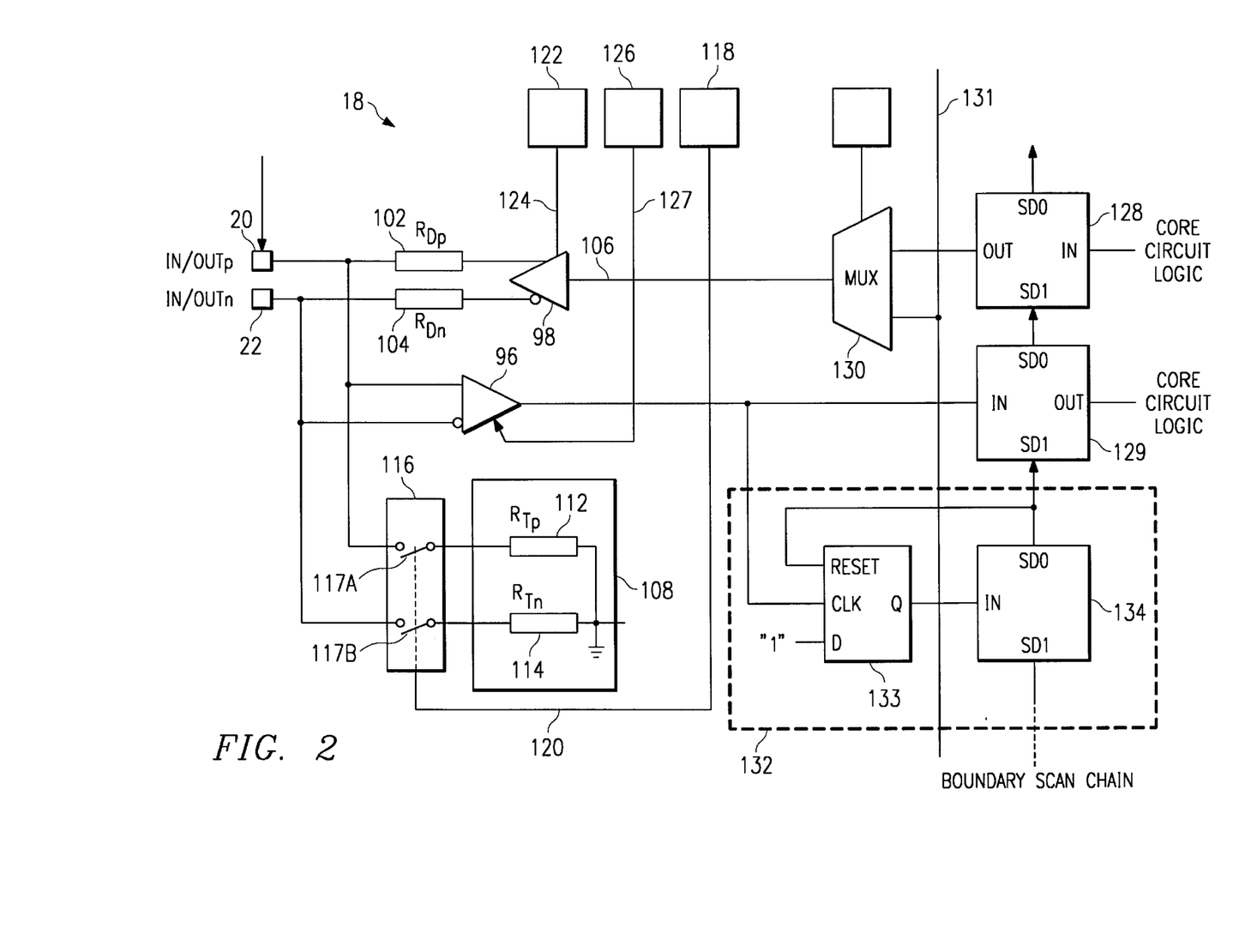
FIG. 2 is a simplified circuit schematic of circuitry including a differential, bidirectional terminal, exemplary of a terminal formed on the integrated circuit pictured together with the testing assembly in FIG. 1.

FIG. 2 illustrates an exemplary, differential terminal pair forming a cell 18 together with additional circuitry which forms a portion of the integrated circuit of the integrated circuit device 12 shown in FIG. 1. The terminal pair forming the cell 18 includes a positive terminal 20 and a negative terminal 22 formed upon, or otherwise accessible at, a surface of the integrated circuit device 12.

The positive terminal pad 20 is coupled to an input terminal of an amplifier forming a receiver 96 and to an output of an amplifier forming a transmitter 98, through a resistor 102. Analogously, the negative terminal 22 is coupled to a negative input of the receiver 96 and to a negative output of the transmitter 98 through the resistor 104. The resistors 102 and 104 are of impedances designated by $R_D$.

Differential inputs received at the terminal pads 20 and 22 are applied to the receiver 96, and internally-generated output signals applied to the transmitter 98 on line 106 are supplied to the terminal pads 20 and 22.

The terminal pair forming the cell 18 is also illustrated to include a built-in termination unit 108 formed of a positive termination resistor 112 and negative termination resistor 114. The resistor 112 is coupled between the terminal pad 20 and a signal ground, and the resistor 114 is coupled between the terminal pad 22 and the signal ground.

A switch element 116 includes switches 117A and 117B positioned in-line between the terminal pads 20 and 22 and the termination resistors 112 and 114, respectively.

Positioning of the switches of the switch element 116 in the illustrated embodiment is controlled by the boundary scan cells, here a flip-flop 118 thereof, connection thereto represented by the line 120. The boundary scan cells are similarly coupled, here by a flip-flop 122 thereof, to the enable control input of the transmitter 98, such connection indicated by the line 124 extending between the flip-flop 122 and the transmitter 98. The boundary scan cells are further similarly coupled, here by a flip-flop 126 thereof, to the receiver, such connection indicated by the line 127 extending between the flip-flop 126 and the enable control input of the receiver 96. The flip-flops 118, 122, and 126 may, e.g., alternately be formed of a mode register of test logic.

Boundary scan cells 128 and 129 are further illustrated in the figure. The cell 128 is coupled to line 106 through a multiplexer 130 to the transmitter 98, and the cell 129 is coupled to the output of the receiver 96. Line 131 forms a second input to the multiplexer 130. As shall be described with respect to FIG. 9 below, narrow pulses are generated on the line 131 when performing dynamic testing of the integrated circuit device. Both cells 128 and 129 are coupled to core circuit logic of the chip interior portion 14 (shown in FIG. 1).

FIG. 2 further illustrates a built-in high-speed pulse detector 132 formed of the elements positioned within the block, shown in dash, in the figure. More particularly, the pulse detector 132 includes a pair of flip-flops 133 and 134. The flip-flop 133 is coupled to the receiver 96 and also to receive a fixed signal, here a logical "one" generated by another portion (not shown) of the circuit undergoing tests. The signal of the logical "one" value is here, representative of a "passed" test. An output of the flip-flop 133 is coupled to an input of the flip-flop 134. An output of the flip-flop 134 is also provided to a reset input of the flip-flop 133. Operation of the pulse detector 132 shall be described more fully with respect to FIGS. 10–11 below.

Once the testing assembly 10 is positioned to contact the terminals of the integrated circuit device 12 which is to undergo testing, test procedures can be performed to test the operation of the integrated circuit device. In one embodiment, static tests are performed upon the terminals first to determine the functionality of the integrated circuit devices and then, if the circuit is determined to be functional, to determine the parameters of operation of the device viz., parametric testing of the circuit is performed to determine if the integrated circuit meets parametric specifications. And, dynamic testing of the integrated circuit device is performed to determine whether the integrated circuit device is operable at desired frequencies of operation.

While not separately shown, it should, of course, be understood that a single-ended terminal pair could similarly be illustrated together with the additional circuitry shown in FIG. 2.

Figure 3:
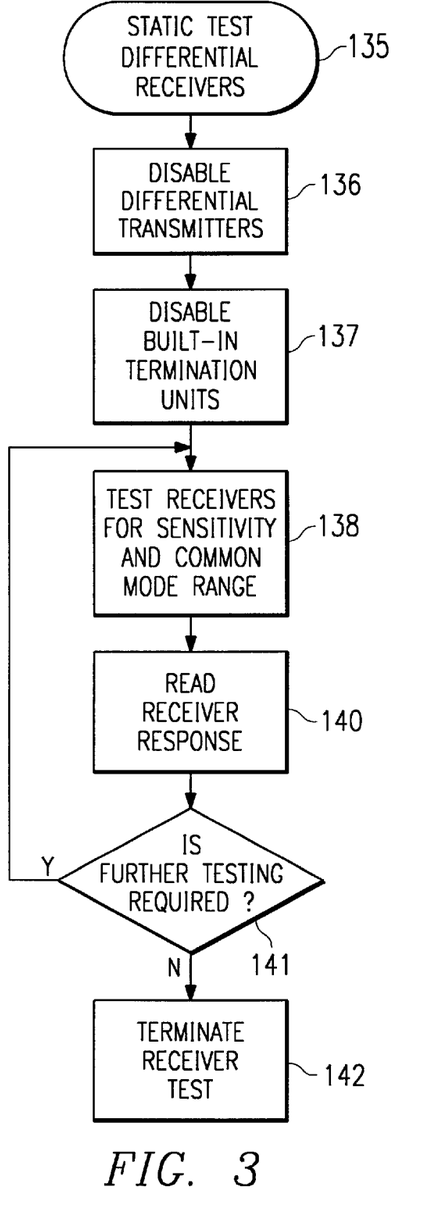
FIG. 3 is a flow diagram which lists the steps of a method of an embodiment of the present invention for performing static tests upon differential receivers of bidirectional terminal pairs.

FIG. 3 illustrates the method steps of a method, shown generally at 135, for performing static tests upon the differential receivers, of which the receiver 96 of the terminal pair 18, shown in FIG. 2 is exemplary. The static tests are performed upon the differential receivers to determine their functionality and the parameters of their operation. First, and as indicated by the block 136, the differential transmitters, such as the transmitter 98 shown in FIG. 1, are disabled, for example, by way of the test port of the tap machine 34. The built-in termination units, such as the built-in termination unit 108 are disabled, as indicated by the block 137. Disabling of the transmitters by way of, e.g., line 124 and termination units by way of, e.g., line 120 can also occur concurrently or in reverse order.

Thereafter, and as indicated by the block 138, the receivers are tested to determine their sensitivity and common mode range. Such testing can be performed, for example, by applying, in an iterative procedure together with blocks 140 and 141 noted below, minimum positive and negative differential voltages at the extremes of the common mode range on the positive and negative supply rails 56 and 58, respectively, such rails forming portions of the testing assembly 10 shown in FIG. 1.

Responses formed by the receivers can be read, as indicated by block 140, via the boundary scan cells by, for example, a test port observer and controller 78 forming the portion of the assembly 10 of FIG. 1. Then, and as indicated by the decision block 141, a determination is made as to whether further testing is required. If so, i.e., if the iterative procedure is completed, the yes branch is taken back to block 138. Otherwise the no branch is taken to block 142 and the receiver test is terminated.

Figure 4:
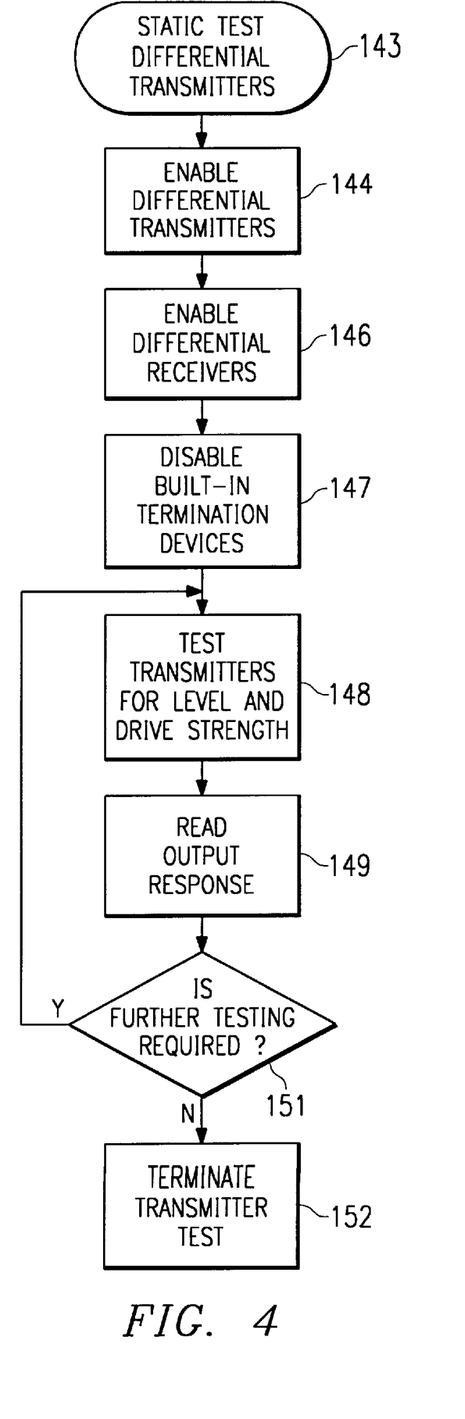
FIG. 4 is a flow diagram which lists the steps of a method of an embodiment of the present invention for performing static tests upon differential transmitters of bidirectional terminal pairs.

Static tests can analogously be performed upon the differential transmitters of the differential terminals. FIG. 4 illustrates a method, shown generally at 143, listing the method steps of a method for performing static tests upon differential transceivers. First, and as indicated by the block 144, the differential transmitters, such as the transmitter 98 shown in FIG. 2, are enabled. The transmitters are enabled, for instance, by way of the test port of the boundary scan circuitry, as above described. In the exemplary terminal pair illustrated in FIG. 2, the transmitter 98 thereof is enabled responsive to appropriate input on line 124.

Then, and as indicated by the block 146, the differential receivers, of which the receiver 96 shown in FIG. 2 is exemplary, are enabled. And, as indicated by the block 147, the built-in termination devices are disabled. Again, other orders of sequences, or concurrent enabling and disabling is possible. In the terminal pair 18 illustrated in FIG. 2, the switches 117 and 117B of the switch element 116 are opened, responsive to appropriate commands generated on the line 120.

Thereafter, the transmitters are tested for level and drive strength of both pullup and pulldown circuitry on both their positive and negative outputs, as indicated by the block 148. With reference back to FIG. 2, a logical "1" stored at the cell 128 activates the positive pullup and negative pulldown. Analogously, a logical "0" stored at the cell 128 activates pulldown on positive and pullup on negative. When testing the transmitters with the testing apparatus, for instance, the voltage levels of the test signal generated on the supply rail 58 is first caused to be of a low voltage level and the voltage level of the test signal generated on the supply rail 56 is generated at two different levels. The response to such different signal levels is observed. After each test step, the circuit response is read, as indicated by block 149.

By generating test signals on the supply rail 56 of a low value, and by generating test signals on the supply rail 58 of two different values, circuit pullup on negative output of the transmitter are tested.

In analogous manners, the circuit can be tested for pulldown responses for both positive and negative outputs. To test for circuit pulldown response on positive outputs, the test signals generated on the supply rail 58 are selected to be of high voltage levels and the test signals generated on the supply rail 56 are selected to be two separate values, and the receiver response to such differing levels is observed.

To test for pulldown response of the circuit responsive to a negative output, the test signals generated on the supply rail 56 are set at high voltage levels, and the test signals generated on the supply rail 58 are selected to be of two different values. The receiver response is then observed.

As indicated by the decision block 151, a determination is made as to whether further testing is required. If so, the yes branch is taken back to block 148. Otherwise the no branch is taken to block 152 and the transmitter test is terminated. Individual ones of the above-noted tests can be performed, and when no further testing is required transmitter testing is terminated.

Figure 5:
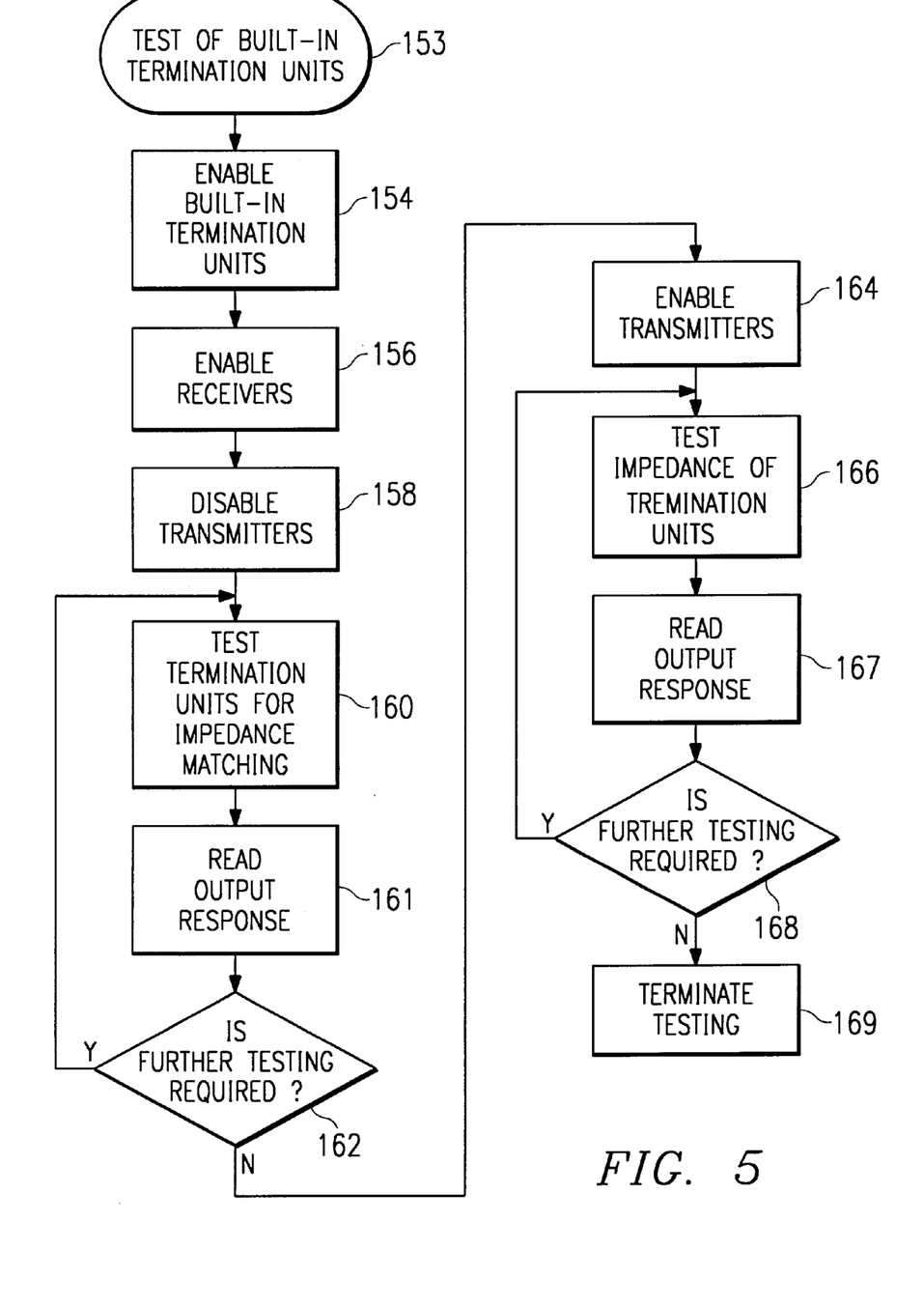
FIG. 5 is a flow diagram which lists the steps of a method of an embodiment of the present invention for performing tests upon built-in differential termination units of bidirectional terminal pairs.

FIG. 5 illustrates a method, shown generally at 153, for testing the built-in termination units, such as the unit 108 shown in FIG. 2, according to an embodiment of the present invention. First, the built-in termination units are enabled, as indicated by the block 154. In the terminal pair 18 shown in FIG. 2, the built-in termination unit 108 is enabled by closing the switch elements 117A and 117B by way of appropriate input on the line 120. As indicated by the block 156, the receivers are enabled. And, as indicated by the block 158, the differential transmitters are disabled, for example, by way of the boundary scan circuitry. Again concurrent enabling and disabling or other sequences are possible.

The termination units are then, as indicated by the block 160, tested for impedance matching. With respect to the testing apparatus 10 shown in FIG. 1, test signals are generated on the supply rails 56 and 58. The voltage level of the test signal generated on the supply rail 58 is first set to be slightly higher than the voltage level of the test signal generated on the supply rail 56.

Then, the voltage level of the test signal generated on the supply rail 58 is set to be somewhat less than the voltage level of the test signal generated on the supply rail 56. Such test can be repeated at several different voltage levels, thereby to determine the impedance matching of the resistors of the built-in termination unit as a function of voltage level. After each of such test steps, the circuit response is read, as indicated by block 161. Then a determination is made, as indicated by the decision block 162, as to whether additional impedance matching testing is required. If so, the yes branch is taken back to block 160. Otherwise, the no branch is taken to block 164.

As indicated by the block 164, the differential transmitters are enabled, again, for example, by way of the boundary scan circuitry. Then, and as indicated by the block 166, the impedance characteristic of the termination unit is tested. The transmitter outputs are set to generate high output signal levels and the test signal generated on the supply rail 58 is selected to be of two separate values. The termination unit impedance is determined as a function of voltage level.

As indicated by the decision block 168, a determination is made as to whether further impedance testing is required. If so, the yes branch is taken back to block 166. Otherwise the no branch is taken to block 169 and the testing is terminated. The testing process can thereby be iteratively performed.

Figure 6:
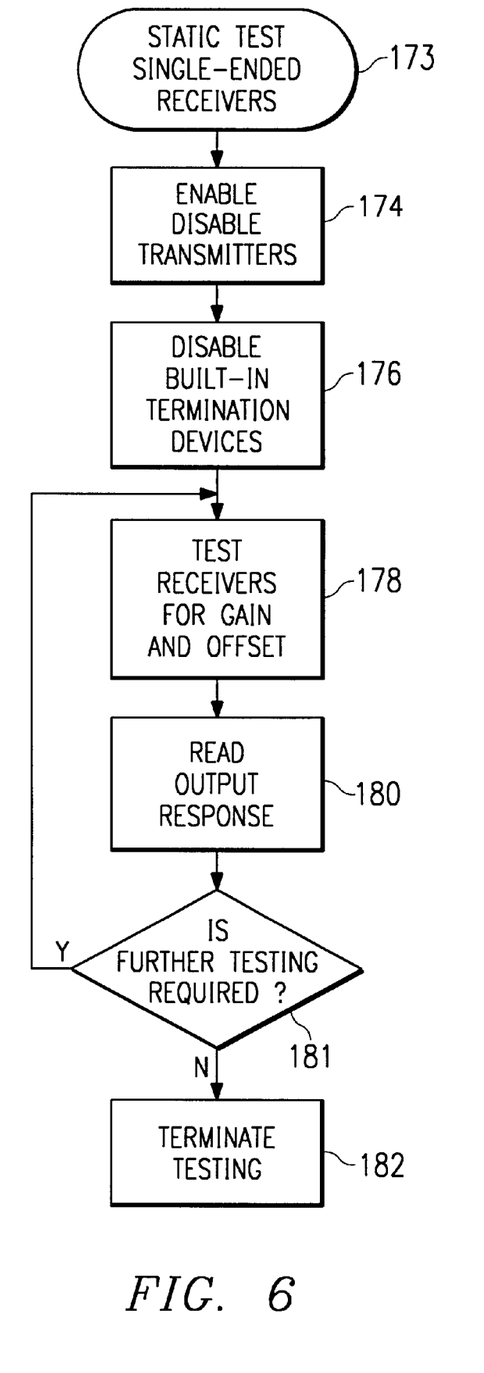
FIG. 6 is a flow diagram which lists the steps of a method of an embodiment of the present invention for performing static tests upon receivers of single-ended terminals.

FIG. 6 illustrates a method, shown generally at 173, for performing static tests upon single-ended receivers. First, and as indicated by the block 174, the transmitters are disabled, for example, by way of the boundary scan circuitry. Then, the built-in termination units, on terminals including such units, are disabled, as indicated by the block 176.

Then, as indicated by the block 178, the receivers of the single-ended terminals are tested to determine their gain and offsets from nominal trigger points. With respect to the testing assembly 10 shown in FIG. 1, test signals are generated on the supply rail 54. The test signals are formed of high and low voltage levels. Then, as indicated by the block 180, the receiver responsive to each input voltage value of the test signal is observed by the test port observer and controller 78. Thereafter, a determination is made at decision block 181 a to whether further testing is required. If so, the yes branch is taken back to block 178. Otherwise, the no branch is taken to block 182, and testing is terminated.

Figure 7:
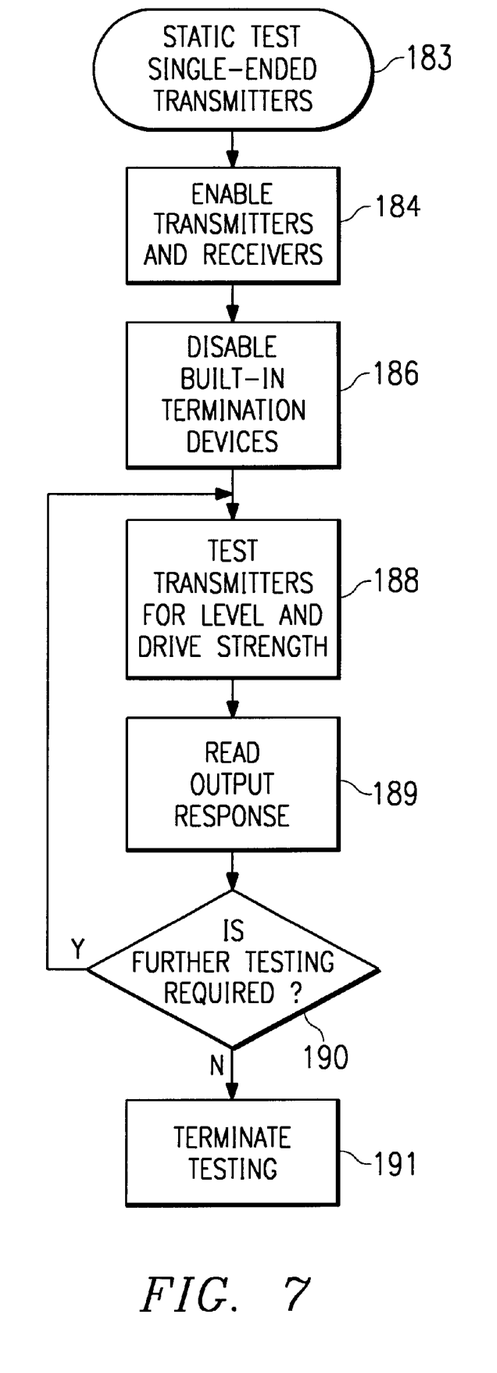
FIG. 7 is a flow diagram which lists the steps of a method of an embodiment of the present invention for performing static tests upon transmitters of single-ended terminals.

FIG. 7 illustrates a method, shown generally at 183, for performing static tests on single-ended transmitters. First, and as indicated by the block 184, the transmitters and receivers of the single-ended terminals are enabled. Then, and as indicated by the block 186, the built-in termination units are disabled.

Then, the transmitters are tested to ensure the functionality of their level and drive strength pullups and pulldowns, as indicated by the block 188. Pullups and pulldowns are activated in manners analogous to those described with respect to method block 148 shown in the flow diagram of FIG. 4, pertaining to the positive terminals of the terminal pairs. In one embodiment, four tests are performed upon the circuit. The single-ended transmitter pullup capabilities are tested in a two-pass procedure in which the test signal generated on the supply rail 54 is selected to be of two different values. The receiver responses of the terminals are observed. The single-ended transmitter pulldown capabilities are similarly tested. After each test sequence, the circuit response is read, as indicated by block 189.

Then, and as indicated by the decision block 190, a determination is made as to whether further testing is required. If so, the yes branch is taken to block 188. Otherwise, the no branch is taken to block 191 and the transmitter test is terminated. Iterative execution of the above-listed test procedures can thereby be performed.

Figure 8:
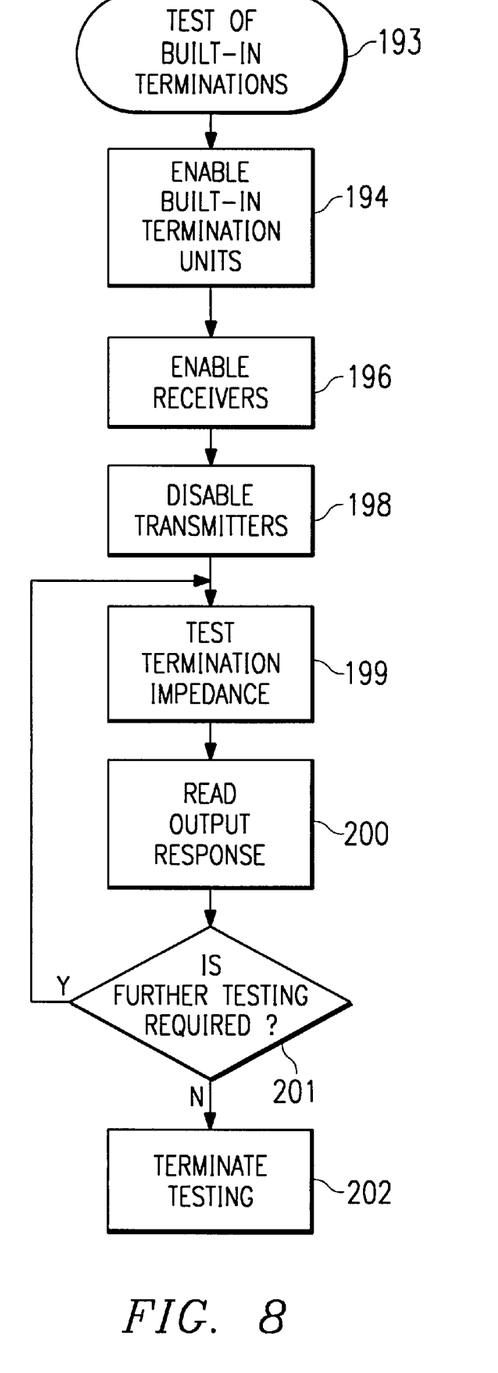
FIG. 8 is a flow diagram which lists the steps of a method of an embodiment of the present invention for performing tests upon built-in termination units of single-ended terminals.

FIG. 8 illustrates a method, shown generally at 193, of a method for testing built-in termination units of single-ended terminals. The termination units of the single-ended terminals are analogous to the termination units of the terminal pair 18 shown in FIG. 2.

First, and as indicated by the block 194, the built-in termination units are enabled. And, as indicated by the block 196, the receivers of the single-ended terminals are enabled. Then, and as indicated by the block 198, the single-ended transmitters of the single-ended terminals are disabled.

The impedances of the termination units are then tested, as indicated by the block 199. Again, the testing can be performed in a two-pass process wherein the voltage levels of the test signals generated on the supply rail 54 are of two different values, and the responses of the receivers of the terminals are observed, as indicated by the block 200.

As indicated by decision block 201, a determination is made as to whether further testing is required. If so, the yes branch is taken back to block 199. Otherwise, the no branch is taken to block 202 and the testing is terminated. The multi-step testing procedure above-described can thereby be iteratively performed.

Operation of the testing apparatus 10 further permits dynamic testing of an integrated circuit device, such as the device 12 shown in FIG. 1.

Figure 9:
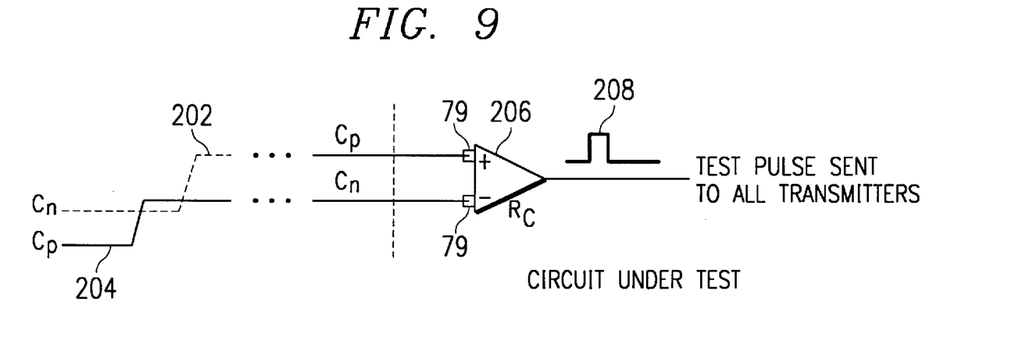
FIG. 9 is an illustration of a manner by which narrow pulses can be formed during operation of an embodiment of the present invention to permit dynamic testing of an integrated circuit device.

FIG. 9 illustrates a manner by which narrow pulses can be generated during operation of an embodiment of the present invention. The pulses are utilized to perform dynamic testing of the circuit device undergoing tests. As mentioned previously, state-of-the-art, integrated circuits are constructed to be operable at increased frequency levels. Existing testing circuitry is unable to generate test signals to perform dynamic testing of such circuits. FIG. 9 illustrates a manner by which test pulses can be created of pulse widths of small time duration (i.e., narrow pulse widths).

The pulses so-generated can be utilized for purposes of dynamic testing of the integrated circuit device undergoing tests. Signals of characteristics corresponding to those of waveforms 202 and 204 are generated by the observer and controller 78 (shown in FIG. 1) and applied to the terminals 79. The terminals 79 form inputs of a receiver portion 206 of a uni-directional terminal.

The signals 202 and 204 are slightly out-of-phase with one another, and the value of the signal 204 is less than the value of the signal 202 at all times but for when the signal 204 changes state from a low value to a high value prior to the time at which the signal 202 changes from a low value to a high value.

The receiver 206 is operative as a differential comparator and generates a positive-valued output pulse when the value of the signal 204 is greater than the value of the signal 202 and returns to a low logical value at other times, thereby to form pulse 208. The phase difference between the signals 202 and 204 is determinative of the pulse width of the pulse 208. By proper selection of the phase difference, the pulse 208 generated by the receiver 206 is caused to be of characteristics which can be used for dynamic testing of the integrated circuit device undergoing testing. The pulses, such as pulse 208, generated by the receiver 206 can be applied to other circuit elements of the integrated circuit device undergoing testing, thereby to dynamically test the operation of such circuitry.

High-frequency signals are not required to be generated externally by the tester apparatus as long as signals are maintained in a desired phase relationship to one another in a manner analogous to the relationship of the signals 202 and 204 illustrated in FIG. 9.

Figure 10:
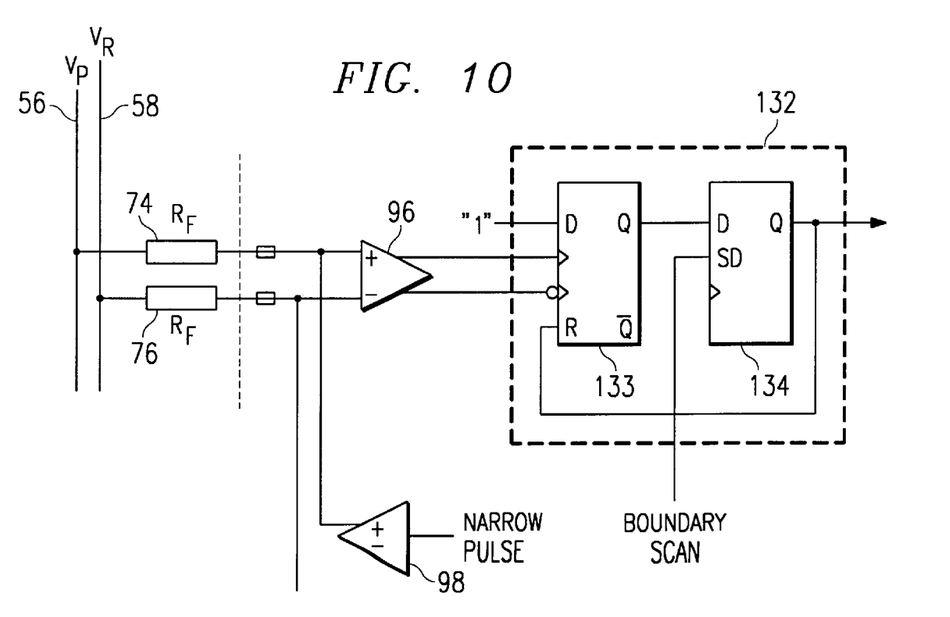
FIG. 10 is a simplified circuit schematic illustrating portions of the testing apparatus of an embodiment present invention and portions of an exemplary integrated circuit undergoing testing by the testing assembly.

FIG. 10 illustrates portions of the testing apparatus 10 and the integrated circuit device 12 shown previously in FIG. 1. The supply rails 56 and 58 and resistors 74 and 76 of the testing apparatus 10 are again shown. During dynamic testing, the supply rails are set to appropriate signal ground voltage levels. Portions of a terminal pair 18 are similarly again shown to include terminals 20 and 22, a receiver 96, and a transmitter 98.

The transmitter 98 is coupled to receive narrow pulses, such as the narrow pulse 208 generated as described with respect to FIG. 9 above. The built-in high speed pulse detector 132 is also again illustrated in the figure. As noted previously the pulse detector 132 includes a pair of flip-flops 133 and 134. As further noted previously, the flip-flop 133 is coupled to the receiver 96 and also to receive a fixed signal, here a logical "one" generated by another portion (not shown) of the circuit undergoing tests. The signal of the logical "one" value is here, representative of a "passed" test. An output of the flip-flop 133 is coupled to an input of the flip-flop 134. An output of the flip-flop 134 is also provided to a reset input of the flip-flop 133. Pulses can be applied to single-ended terminals in manners analogous to their application to the differential terminals described with respect to FIG. 10.

Figure 11:
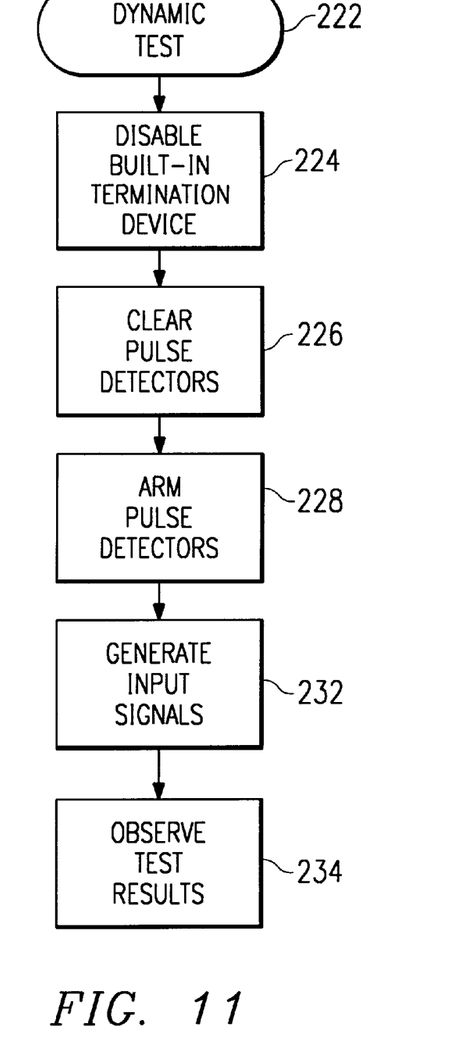
FIG. 11 is a flow diagram which lists the method steps of a method of an embodiment of the present invention to perform dynamic testing of an integrated circuit device.

FIG. 11 illustrates the method steps of a method, shown generally at 222, for performing a high-speed, dynamic test of an integrated circuit device utilizing the narrow pulses, such as the pulse 208 described above.

First, and as indicated by block 224, the built-in termination devices are disabled. Then, and as indicated by the block 226, the pulse detectors, such as the pulse detector 212, are cleared by scanning a logical "one" through the boundary scan cells of the boundary scan circuitry of the integrated circuit.

Then, and as indicated by the block 228, the pulse detectors are "armed" by scanning a logical-value "zero" into the flip-flop 216. Then, and as indicated by the block 232, signals, such as the signals 202 and 204 are generated and applied to a receiver, such as the receiver 206 shown in FIG. 9, thereby to form a test pulse. Then, and as indicated by the block 234, results of the test can be determined by evaluating the values of the boundary scan circuitry.

Figure 12:
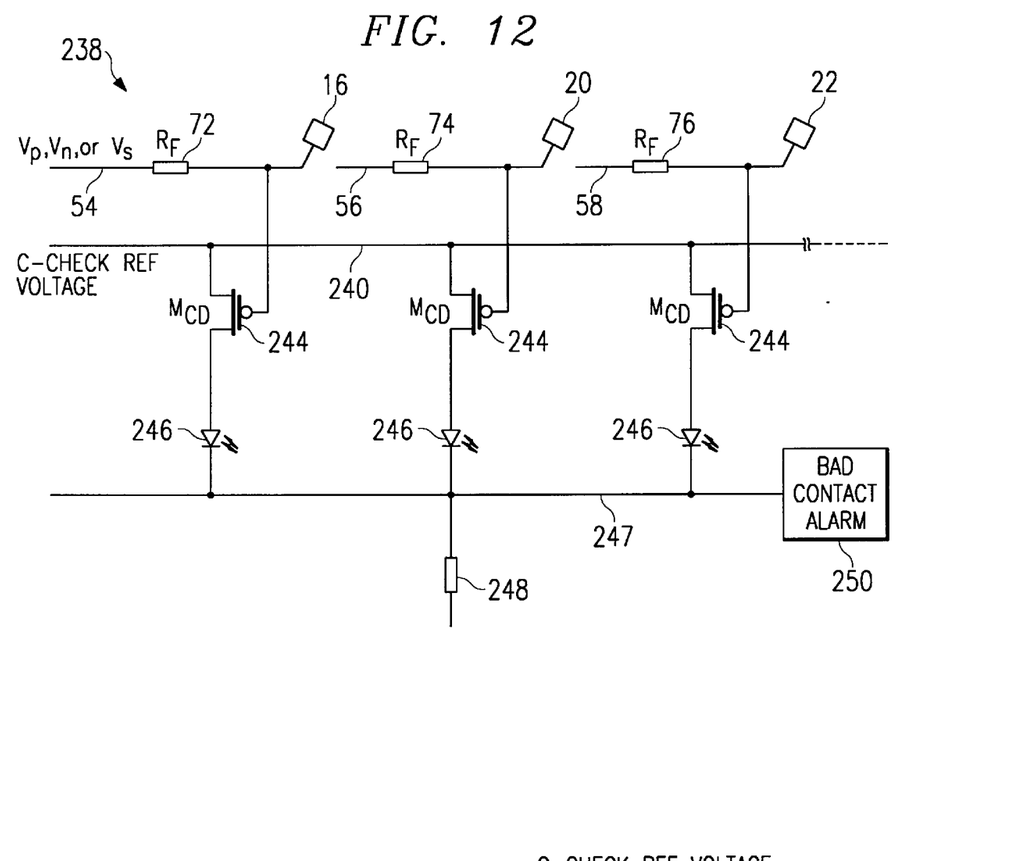
FIG. 12 is a circuit schematic of a portion of a testing assembly of another embodiment of the present invention.
Figure 13:
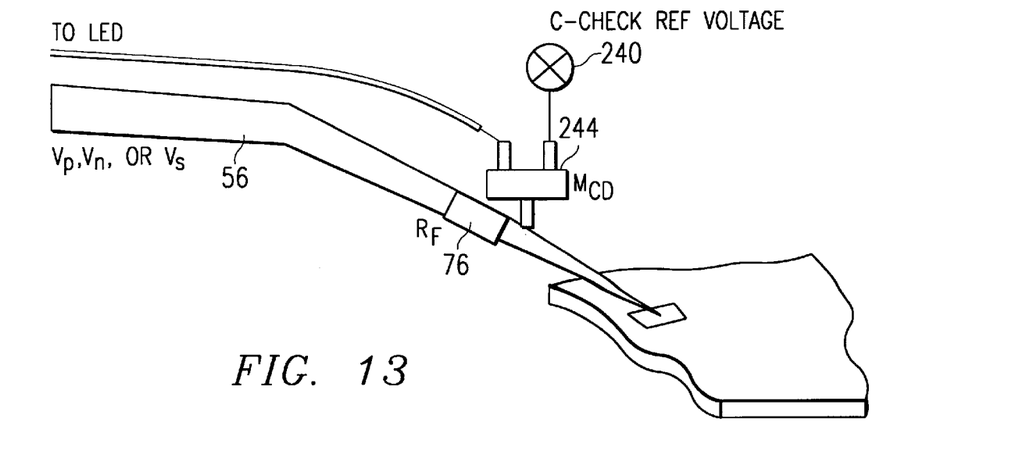
FIG. 13 is an enlarged view of a single probe element which forms a portion of the testing assembly shown in FIG. 12.

FIGS. 12 and 13 illustrate a portion of the testing assembly 10 of a further embodiment of the present invention. For the integrated circuit device undergoing testing to be tested properly, contact must be made by the testing apparatus with the terminals of the integrated circuit device undergoing testing. If contact is not appropriately made, the testing operations are likely to be inadequate. Therefore, it is important to ensure that the testing apparatus contacts with all of the terminals of the integrated circuit.

The circuitry illustrated in FIGS. 12 and 13, referred to generally at 238, provides an indication of contact between the testing apparatus and the terminals of the integrated circuit device undergoing testing. The circuitry 238 is exemplary of the circuitry which provides indications of contact of the various bidirectional portions of the device undergoing testing. Here, the circuitry 238 is shown to test the contact of the testing apparatus to three exemplary terminals 16, 20, and 22 of the integrated circuit device undergoing testing. Such circuitry is duplicated for each terminal 16, 20, and 22, as appropriate, of the integrated circuit device undergoing testing.

The signal rails 54, 56, and 58 are again shown to extend to terminals 16, 20, and 22 through resistors 72, 74, and 76, respectively, as previously shown in FIG. 1. The resistors 72, 74, and 76 are preferably of low impedance values to permit operation of the circuit with low levels of current drain. The circuitry 238 here is shown to include a contact-check reference voltage line 240 upon which a reference voltage is generated. A transistor 244 is associated with each of the terminals 16, 20, and 22. A gate electrode of each of the transistors 244 is coupled to an appropriate one of the signal rails 54, 56, or 58. Remaining electrodes of the transistors 244 are coupled between the voltage line 240 and light emitting diodes 246. The diodes 246 are coupled to an offset potential (e.g., a ground potential) through resistor 248. If adequate contact with any of the terminals 16, 20, and 22 is not formed, the transistor 244 associated with such terminal turns-on, the diode 246 associated therewith turns-on, and a signal is generated on line 247. Line 247 is coupled to a bad contact alarm 250, and appropriate annunciation is made.

The voltage levels of the supply rails 54, 56, and 58 and of the line 240 are selected such that, when the contact is made with a terminal 16, 20, or 22, as relevant, the voltage drop across the corresponding one of the resistors 72, 74, or 76 causes the voltage differential between the line 240 and the gate electrode not to be great enough to turn the transistor on. Conversely, if the proper contact is not made with the terminal, the voltage differential between the gate electrode of the associated transistor and the line 240 is great enough to turn the transistor on, and power the associated diode 246. While the illustrated embodiment utilizes p-channel MOSFET transistors 244, other transistors can, of course, instead be utilized with appropriate changes in biasing voltages on the lines 54, 56, and 58, as appropriate.

During initial positioning of the testing apparatus 10 together with an integrated circuit device, the signal generated on line 247 can be used in a feedback control arrangement to determine when the testing apparatus is properly positioned. Lighting of the diodes 246 facilitates troubleshooting operations, if necessitated, to complete the proper contacting of the testing apparatus with the integrated circuit undergoing testing.

FIG. 13 illustrates an exemplary physical arrangement of contact detecting circuitry for probe card fixturing of a device under test which forms a portion of the testing assembly 10 including the circuitry 238 shown in FIG. 12. The small distance separating the resistor and the probe tip is shown in FIG. 13. Such small distance facilitates high-speed, i.e., dynamic testing operations. Inadequate connections between the testing assembly and terminals of the integrated circuit undergoing testing are detected and indicated so that appropriate correction of the connection can be effectuated. While the physical arrangement of the circuitry 238 utilized in the testing of a packaged integrated circuit is not separately shown, the arrangement is similar but for the positioning of the transistors 244 thereof.

Operation of various of the embodiments of the present invention permits an integrated circuit device having almost any number of input and output terminals to be tested. Static testing, both functional and parametric testing, and also dynamic testing of the circuit device can be performed.

The integrated circuit device undergoing testing can include single-ended terminals or differential terminal pairs, or any combination of such different types of terminals.

Testing operations can be performed either on-wafer or after packaging operations have been performed and the packaged integrated circuit packages have been created. When testing operations are performed upon the integrated circuit packages, connections formed during the packaging operations can further be tested.

Test signals can be also be applied to an integrated circuit device to permit dynamic testing of the circuit device to provide indications of operability of the integrated circuit device at high frequencies. Testing of integrated circuit devices, both while still on-wafer and subsequent to packaging, can be economically performed. Integrated circuits determined to have defects found to have either defects or connection errors can be marked, or otherwise set aside, to ensure that such defective circuit devices are not used in an electronic circuit.

The previous descriptions are of preferred examples for implementing the invention, and the scope of the invention should not necessarily be limited by this description. The scope of the present invention is defined by the following claims.

What is claimed is:

1. A testing assembly for testing an integrated circuit device having a plurality of terminals, said testing assembly comprising:

a voltage signal generator for generating test signals of selected voltage levels;

a first signal rail coupled to receive the test signals generated by said voltage signal generator and positionable to extend along at least a portion of the integrated circuit device, said first signal rail for conducting the test signals generated by said voltage signal generator therealong;

a first group of impedance elements positioned in series with said first signal rail, the impedance elements of said first group of impedance elements corresponding in number with a first subset of the terminals of the plurality of terminals of the integrated circuit device, each impedance element of said first group of impedance elements coupled between said first signal rail and a terminal of at least first selected terminals of a first group of the plurality of terminals, thereby to apply the test signals conducted along said first signal rail to the first selected terminals, each impedance element of said first group of impedance elements of an impedance level generally matching impedance levels of at least portions of the integrated circuit device;

testing means that is capable of testing at least one element of the integrated circuit device, said one element selected from the group consisting of a receiver, a transmitter, and a termination unit; and a test signal-response indicator coupled to selected terminals of a second group of the plurality of terminals of the integrated circuit device, said test signal-response indicator for indicating values of output signals generated at the terminals responsive to application of the test signals to the terminals.

2. The testing assembly of claim 1 wherein the test signals generated by said voltage signal generator are formed by the plurality of signal portions, each signal portion of a selected voltage level.

3. The testing assembly of claim 1 further comprising:

a second signal rail coupled to receive the test signals generated by said voltage signal generator, said second signal rail also positionable to extend along the at least a portion of the integrated circuit device, said second signal rail for conducting the test signals generated by said voltage signal generator therealong; and a second group of impedance elements positioned in series with said second signal rail, the impedance elements of said second group of impedance elements corresponding in number with the terminals of the plurality of terminals of the integrated circuit device, each impedance element of said second group of impedance elements coupled between said second signal rail and a terminal of at least second selected terminals of the first group of the plurality of terminals, thereby to apply the test signals conducted along said second signal rail to the second selected terminals, each impedance element of said second group of impedance elements of an impedance level generally matching impedance levels of portions of the integrated circuit device.

4. The testing assembly of claim 3 wherein said voltage signal generator comprises a first output port and a second output port, said first signal rail coupled to said first output port and said second signal rail coupled to said second output port.

5. The testing assembly of claim 4 wherein the plurality of terminals include differential terminal pairs, each terminal pair having a positive terminal and a negative terminal, and wherein said first group of impedance elements connect said first signal rail to the positive terminals of the differential terminal pairs and said second group of impedance elements connect said second signal rail to negative terminals of the differential terminal pairs.

6. The testing assembly of claim 5 wherein the test signals generated by said voltage signal generator comprise positive differential voltage signals applied to the differential terminal pairs.

7. The testing assembly of claim 5 wherein the test signals generated by said voltage signal generator comprise negative differential voltage signals applied to the differential terminal pairs.

8. The testing assembly of claim 5 wherein the test signals generated by said voltage signal generator comprise a plurality of different, differential voltage signals applied to the differential terminal pairs.

9. The testing assembly of claim 1 wherein the plurality of terminals includes single-ended terminals, and wherein said first signal rail is coupled to said single-ended terminals.

10. The testing assembly of claim 9 wherein the test signals generated by said voltage signal generator are of voltage levels at least as large as a selected, minimum voltage level.

11. The testing assembly of claim 9 wherein the test signals generated by said voltage signal generator are of voltage levels less than a selected voltage level.

12. The testing assembly of claim 1 wherein said test signal response indicator comprises a digital value indicator.

13. The testing assembly of claim 12 wherein the digital value indicator comprises a boundary scan device.

14. The testing assembly of claim 13 wherein said boundary scan device comprises a test data output of a boundary scan element forming a portion of the integrated circuit device.

15. The testing assembly of claim 1 further comprising a contact determiner for determining whether said first signal rail contacts properly with the at least first selected terminals of the first group of the terminals of the integrated circuit device.

16. The testing assembly of claim 1 wherein the test signals generated by said voltage signal generator are of characteristics which, when applied to the integrated circuit device, test for dynamic operatiblity of the integrated circuit device.

17. The testing assembly of claim 1 wherein the integrated circuit device further comprises a pulse-signal comparator-receiver, said voltage signal generator further for generating a first signal pulse and a second signal pulse for application to the comparator-receiver, the first and second signal pulses, respectively, offset in phase relative to one another, and the second signal pulse of a greater maximum value than a maximum value of the first signal pulse and of a greater minimum value than a minimum value of the first signal pulse, and the comparator-receiver of the integrated circuit device for generating a test pulse when the first signal pulse is of a value greater than a value of the second signal pulse.

18. The testing assembly of claim 16 wherein the first group of the plurality of terminals each comprise a transmitter portion and wherein the test pulse generated by the comparator-receiver is applied to transmitter portions of each of the plurality of terminals.

19. In a method for dynamic testing of an integrated circuit device having an internal circuit portion and a plurality of bidirectional terminals, each bidirectional terminal having a receiver, a transmitter, and a pulse-signal comparator-receiver, an improvement of a method for testing dynamic operation of the internal circuit portion by applying a test pulse having a first selected pulse width thereto utilizing a test signal generator, the test signal generator capable of generating a pulse having no smaller than a second pulse width, the second pulse width larger than the first pulse width, said method comprising the steps of:

generating a first signal pulse at the test signal generator, the first signal pulse having a first-signal minimum signal value and first-signal maximum signal value;

generating a second signal pulse at the test signal generator, the second signal pulse having a second-signal minimum signal, the second-signal minimum signal value greater than the first-signal minimum signal value, and a second signal-maximum signal value, the second-signal maximum signal value greater than the first-signal maximum signal value, the second signal pulse generated at a selected time delay relative to generation of the first signal pulse during said step of generating the first signal pulse, thereby to be offset in phase relative to the first signal pulse;

concurrently applying the first signal pulse and the second signal pulse to the pulse-signal comparator receiver of the integrated circuit device;

forming a test pulse at the pulse signal comparator-receiver of the integrated circuit device responsive to application of the first and second signal pulses, respectively, during said step of applying, the test pulse of a pulse width responsive to the phase by which the first and second signal pulses, respectively, are offset from one another;

providing the test pulse formed during said step of forming to the transmitters of the bidirectional terminals; and observing operation of the integrated circuit device responsive to the test pulse provided during said step of providing.

20. In a testing assembly for testing a device under test, the device under test having a plurality of terminals, the testing assembly having a plurality of probe elements, each probe element for contacting with a separate terminal of the plurality of terminals, an improvement of a contact determiner for determining electrical contact of each of the probe elements with each of the at least selected terminals of the device under test, said contact determiner comprising:

a plurality of switch devices, a separate switch device of said plurality of switch devices associated with each separate probe element of the testing assembly, each switch device having a first side and a second side;

a voltage source coupled in series to the first side of each switch device of said plurality of switch devices;

a plurality of annunciators, a separate annunciator associated with each separate terminal of the at least selected terminals of the device under test and probe element of the testing assembly, each annunciator coupled to a second side of a switch device of said plurality of switch devices associated with a corresponding one of the at least selected terminals; and each switch device of said plurality of switch devices positioned in a closed position when the probe element associated therewith fails to contact with a terminal of the plurality of terminals, thereby to power the annunciator to annunciate lack of the electrical contact between the probe element and the terminal.

21. A method for testing an integrated circuit device having a plurality of terminals, said method comprising the steps of:

connecting a testing assembly to at least a portion of said plurality of terminals of said integrated circuit device, said integrated circuit device having a plurality of elements that share access to either a single terminal or a single set of terminals;

disabling at least a first element of said integrated circuit device;

enabling at least a second element of said integrated circuit device;

testing said second element of said integrated circuit device;

reading an output response of said integrated circuit device; and terminating the testing of said second element of said integrated circuit device.

22. The method according to claim 21, wherein:

the step of disabling further comprises the step of disabling at least a transmitter and a termination unit;

the step of enabling further comprises the step of enabling at least a receiver; and the step of testing further comprises the step of testing said receiver.

23. The method according to claim 22, wherein:

the step of testing said receiver further comprises the step of testing differential receivers for sensitivity or common mode range.

24. The method according to claim 22, wherein:

the step of testing said receiver further comprises the step of testing said receiver for gain or offset, said receiver being single-ended.

25. The method according to claim 21, wherein:

the step of disabling further comprises the step of disabling at least a termination unit;

the step of enabling further comprises the step of enabling at least a receiver and a transmitter; and the step of testing further comprises the step of testing said transmitter.

26. The method according to claim 25, wherein:

the step of testing said transmitter further comprises the step of testing differential transmitters for level or drive strength.

27. The method according to claim 25, wherein:

the step of testing said transmitter further comprises the step of testing said transmitter for level or drive strength, said transmitter being single-ended.

28. The method according to claim 21, wherein:

the step of disabling further comprises the step of disabling at least a transmitter;

the step of enabling further comprises the step of enabling at least a receiver and a termination unit; and the step of testing further comprises the step of testing said termination unit.

29. The method according to claim 28, wherein:

the step of testing said termination unit further comprises the step of testing an impedance aspect of said termination unit.

30. The method according to claim 29, further comprising the steps of:

enabling at least said transmitter and retesting said termination unit after the step of testing said termination unit; and wherein the step of retesting said termination unit further comprises the step of retesting an impedance aspect of said termination unit.

* * * * *